(12) United States Patent
Kusunoki et al.

(10) Patent No.: US 7,635,413 B2
(45) Date of Patent: Dec. 22, 2009

(54) METHOD FOR PREPARING SILICON CARBIDE SINGLE CRYSTAL

(75) Inventors: Kazuhiko Kusunoki, Amagasaki (JP); Kazuhito Kamei, Hyogo (JP); Nobuyoshi Yashiro, Amagasaki (JP); Akihiro Yauchi, Nishinomiya (JP); Yoshihisa Ueda, Kobe (JP); Yutaka Itoh, Amagasaki (JP); Nobuhiro Okada, Amagasaki (JP)

(73) Assignee: Sumitomo Metal Industries, Ltd., Osaka (JP)

( * ) Notice: Subject to any disclaimer, the term of this patent is extended or adjusted under 35 U.S.C. 154(b) by 0 days.

(21) Appl. No.: 11/712,841

(22) Filed: Mar. 1, 2007

(65) Prior Publication Data
US 2007/0209573 A1  Sep. 13, 2007

Related U.S. Application Data

(63) Continuation of application No. PCT/JP2005/015844, filed on Aug. 31, 2005.

(30) Foreign Application Priority Data

Sep. 3, 2004 (JP) ............................. 2004-257041
Oct. 19, 2004 (JP) ............................. 2004-304132
Nov. 24, 2004 (JP) ............................. 2004-338898

(51) Int. Cl.
*C30B 23/00* (2006.01)
*C30B 28/12* (2006.01)

(52) U.S. Cl. ............................. 117/13; 117/14; 117/40; 117/951; 117/200; 117/201; 117/202; 117/204; 117/218

(58) Field of Classification Search .................. 117/40, 117/951, 200–202, 204, 218, 13, 14
See application file for complete search history.

(56) References Cited

U.S. PATENT DOCUMENTS 4,152,194 A * 5/1979 Frosch et al. .................. 117/36

(Continued)

FOREIGN PATENT DOCUMENTS

DE  2553113 A * 6/1977

(Continued)

OTHER PUBLICATIONS

Syväjärvi et al., Liquid Phase Epitaxial Growth of SiC, Journal of Crystal Growth, 197 (1999), pp. 147-154, Linköping University, Linköping, Sweden.
Hofmann et al., Prospects of the Use of Liquid Phase Techniques for the Growth of Bulk Silicon Carbide Crystals, Material Science & Engineering, B61-62 (1999) pp. 29-39, University of Erlangen-Nürnberg, Erlangen, Germany.

*Primary Examiner*—Robert M Kunemund
*Assistant Examiner*—G. Nagesh Rao
(74) *Attorney, Agent, or Firm*—The Webb Law Firm

(57) ABSTRACT

A SiC single crystal is produced by the solution growth method in which a seed crystal attached to a seed shaft is immersed in a solution of SiC dissolved in a melt of Si or a Si alloy and a SiC single crystal is allowed to grow on the seed crystal by gradually cooling the solution or by providing a temperature gradient therein. To this method, accelerated rotation of a crucible is applied by repeatedly accelerating to a prescribed rotational speed and holding at that speed and decelerating to a lower rotational speed or a 0 rotational speed. The rotational direction of the crucible may be reversed each acceleration. The seed shaft may also be rotated synchronously with the rotation of the crucible in the same or opposite rotational as the crucible. A large, good quality single crystal having no inclusions are produced with a high crystal growth rate.

11 Claims, 2 Drawing Sheets

U.S. PATENT DOCUMENTS

| | | | |
|---|---|---|---|
| 4,909,998 A * | 3/1990 | Nishizawa | 117/223 |
| 5,126,114 A * | 6/1992 | Kamio et al. | 117/213 |
| 5,139,750 A * | 8/1992 | Shima et al. | 117/213 |
| 5,593,498 A * | 1/1997 | Kimbel et al. | 117/201 |
| 6,270,569 B1 * | 8/2001 | Shibata et al. | 117/68 |
| 6,428,621 B1 * | 8/2002 | Vodakov et al. | 117/108 |
| 7,112,242 B2 * | 9/2006 | Hara et al. | 117/84 |
| 7,361,222 B2 * | 4/2008 | Janzen et al. | 117/103 |
| 2002/0023581 A1 * | 2/2002 | Vodakov et al. | 117/108 |
| 2002/0108559 A1 * | 8/2002 | Iwane et al. | 117/54 |
| 2002/0157600 A1 * | 10/2002 | Fusegawa et al. | 117/30 |
| 2003/0140859 A1 * | 7/2003 | Ukiyo et al. | 118/726 |
| 2004/0194694 A1 * | 10/2004 | Sugiyama et al. | 117/200 |
| 2004/0237879 A1 * | 12/2004 | Kaneko et al. | 117/2 |
| 2005/0257736 A1 * | 11/2005 | Shimosaka et al. | 117/217 |
| 2007/0110657 A1 * | 5/2007 | Hunter | 423/345 |
| 2007/0209573 A1 * | 9/2007 | Kusunoki et al. | 117/28 |
| 2008/0149020 A1 * | 6/2008 | Janzen et al. | 117/89 |

FOREIGN PATENT DOCUMENTS

| | | |
|---|---|---|
| JP | 60231491 A * | 11/1985 |
| JP | 08-337494 | 12/1996 |
| JP | 2000-264790 | 9/2000 |
| JP | 2001-247400 | 9/2001 |
| JP | 2003-171199 | 6/2003 |
| JP | 2004-002173 | 1/2004 |

* cited by examiner

SiC single crystal formed by solution growth 0.2mm

- Gas inlet
- Sead shaft
- Lid
- Water-cooled chamber
- High-frequency coil
- Seed crystal
- Graphite crucible
- Melt
- Insulator
- Gas outlet

METHOD FOR PREPARING SILICON CARBIDE SINGLE CRYSTAL

TECHNICAL FIELD

This invention relates to a method for producing a good quality single crystal of silicon carbide suitable as a material for optical devices and electronic devices, and particularly to a method which can produce a good quality silicon carbide single crystal at a high growth rate with certainty by the solution growth method.

BACKGROUND ART

Silicon carbide (SiC) is a type of compound semiconductor which is thermally and chemically stable. It has properties which are advantageous compared to those of silicon (Si) in that it has approximately three times the band gap, approximately ten times the dielectric breakdown voltage, approximately two times the electron saturation speed, and approximately three times the thermal conductivity of Si. On account of these superior properties, it is anticipated that SiC will be capable of use as a material for electronic devices such as power devices which overcomes the physical limits of Si devices and environmentally resistant devices which operate at high temperatures.

In optical devices on the other hand, nitride-type materials (GaN, AlN) are being developed with the object of shortening wavelengths. SiC has a particularly small lattice misfit with respect to the nitride-type materials compared to other compound semiconductors, so it has attracted attention for use as a substrate for epitaxial growth of nitride-type materials.

However, SiC is well known as a material having polytypes (crystalline polymorphism). Polytypes are the state that the same stoichiometric composition has a plurality of crystalline forms which are different with respect to the mode of stack of atoms only in the c-axis direction. Typical polytypes of SiC include 6H type (a hexagonal system having six molecules per period), 4H type (a hexagonal system having four molecules per period), and 3C type (a cubic system having three molecules per period). Coexistence of at least two different crystal types is undesirable from the standpoint of application thereof to devices.

In order to apply SiC to electronic devices and optical devices, it is necessary to have good quality single crystals in bulk form or in film form having a single crystal form (not a mixture of two or more polytypes) and having no or very few defects.

Previously known methods for producing a SiC single crystal include the sublimation method and the chemical vapor growth (CVD) method, which are methods of growth in vapor phase, and the solution growth method, which is a method of growth in a liquid phase.

In the sublimation method, a raw material which is SiC powder is sublimated at a high temperature of 2200-2500° C., and a SiC single crystal is recrystallized on a seed of a SiC single crystal disposed in a lower temperature zone.

In the CVD method, a silane gas and a hydrocarbon gas are used as raw materials, and a SiC single crystal is allowed to epitaxially grow on a substrate made of a Si or SiC single crystal.

In the solution growth method, carbon is dissolved in a melt of Si or a Si alloy to prepare a solution of SiC dissolved in the melt. A SiC seed crystal is immersed in the high temperature SiC solution in molten Si or a molten Si alloy as a solvent, and by making the SiC solution supercooled at least in the vicinity of the seed crystal, the SiC concentration in the solution is made supersaturated, thereby allowing a SiC single crystal to grow on the seed crystal.

In the solution growth method, there are two methods of creating a supercooled state, which are the temperature difference method and the slow cooling method. In the temperature difference method, a temperature gradient is established in the melt so that the temperature in the vicinity of the seed crystal is lower than in other portions of the melt, and the SiC concentration of the melt is supersaturated locally only in the vicinity of the seed crystal. In the slow cooling method, the entirety of a melt is gradually cooled, and the overall SiC concentration is made supersaturated. Since the slow cooling method is a batch operation, it is suitable for obtaining a SiC single crystal in thin film. In contrast, the temperature difference method allows a single crystal to continuously grow, and it is suited for the production of a SiC single crystal in bulk form.

It is easy for the sublimation method to produce a large bulk crystal, so commercial production of single crystalline SiC wafers is presently carried out by the sublimation method. However, a SiC single crystal which is grown by the sublimation method has problems with respect to the quality as a crystal in that it easily develops crystal defects such as hollow core defects referred to as micropipes, screw dislocations, and stacking faults.

The CVD method is used primarily for growth of SiC crystals in thin film due to its relatively slow growth rate. The quality of a thin film SiC single crystal is affected by the substrate. Due to the above-described problems with the quality of SiC substrates produced primarily by the sublimation method, there are limitations on improving the quality of thin films.

In the solution growth method which is a method of liquid phase growth, crystal growth occurs in a state close to thermal equilibrium, so it is possible to obtain single crystal having a markedly better crystallinity (free from contamination by different polytypes) than with vapor phase growth. As stated above, a melt of Si or a Si alloy is used as a solvent for a SiC solution.

However, various technical problems remain in obtaining SiC crystals of large area and high quality by the solution growth method.

Material Science and Engineering, B61-62 (1999) 29;-39, for example, describes that a technical problem in achieving high quality SiC is that when a SiC single crystal is grown from a solution having Si as a solvent, Si inclusions develop inside the SiC crystal. These inclusions are caused by a nonuniform surface in the growth interface referred to as a morphological instability. This nonuniform surface has a macrostep structure, and it is thought that Si which is the solvent enters between the macrosteps and is enclosed within a crystal by growth of the steps in the transverse direction.

J. Crystal Growth, 197 (1999) 147-154 describes that circular pits develop in the crystal surface in liquid phase epitaxial growth from a Si—Sc—C ternary solution. These pits are caused by foreign matter such as carbon particles which are deposited on the growth interface during crystal growth.

The term "inclusions" encompasses any phase which is incorporated into a single crystal from any cause and is different from the desired single crystal. When a SiC single crystal is grown by the solution growth method, a typical inclusion is a particle derived from droplets of Si from a solvent or C which are captured inside the crystal during crystal growth. This is caused by a nonuniform surface present at the crystal growth interface. When SiC crystals are grown by the solution growth method, the solubility of SiC in a melt of Si or a Si alloy is low, and the degree of supersaturation of the solution is often low, so step bunching easily occurs. As a result, the solvent is left between steps and becomes inclusions. Besides, silicides, carbides, nitrides, oxides, and the like can also become inclusions. Furthermore, a SiC crystal which is different from a desired polytype, such as a 3C—SiC crystal incorporated into a 6H—SiC single crystal, gas (bubbles) enclosed within a crystal, graphite particles incorporated into a solution, and similar substances can also become inclusions. A SiC single crystal having inclusions incorporated therein are unsuitable for use as devices.

FIG. 1 shows an optical photomicrograph of the cross section of a SiC single crystal containing inclusions which result from a Si solvent captured into a crystal and which were observed in growth experiments carried out by the present inventors. In the figure, the black portions at the ends of the downward pointing arrows are inclusions caused by enclosed solution.

In a single crystal, inclusions and pits are macro defects, which are not permissible in a material for devices. Such defects appear even during crystal growth on a research scale with a single crystal size of 2 inches or less. In addition, if the conditions of temperature or supply of a solute become nonuniform in a growth interface where crystal growth occurs, a nonuniform distribution in thickness develops in the resulting crystal. Particularly in a thin film single crystal, if the crystal thickness becomes nonuniform, the desired device performance can no longer be obtained, so such nonuniformity is also not permissible in a material for devices.

Technical challenges associated with high speed growth of SiC single crystals include increasing the growth rate while maintaining a high crystal quality. In general, in the growth of a SiC single crystal by the solution growth method, the growth rate is low. For example, in the case of solution growth using Si as a solvent, the growth rate at a melt temperature of 1650° C. is approximately 5-12 μm per hour. This growth rate is 1 to 2 orders of magnitude smaller than with the sublimation method. The reason why the growth rate of an SiC crystal is slow in the solution growth method is thought to be because the solubility of carbon in the solution and hence the SiC concentration are low.

The present inventors succeeded in increasing the solubility of carbon in a solution using a Si—Ti or Si—Mn solvent and growing a SiC bulk single crystal (JP 2004-2173 A1). However, even in that method, when the growth rate is increased, problems in the form of the above-described inclusions or nonuniformity of the growth rate inside the crystal plane may occur, and it is difficult to achieve stable high-speed growth of at least 100 μm per hour while maintaining crystal quality.

JP 2000-264790 A1 discloses a method in which a raw material comprising at least one transition metal element, Si, and C is heated to melt and the resulting melt is cooled to precipitate and grow a SiC single crystal. In this method, an optimal composition of solution is estimated based on a ternary phase diagram. However, in both experiments and calculations, there is almost no sufficiently is reliable Si—C-M system diagram (M=various elements) which is known at present, and it is not possible to determine an optimal composition of solution merely from a phase diagram. Even if an optimal composition of solution can be estimated, during cooling or under a temperature gradient for growth, various secondary products may be formed, and the seed crystal may dissolve or react with the crucible to cause damages to the crucible, so a SiC single crystal cannot always be stably obtained. Accordingly, it is necessary to determine an optimal composition by actually carrying out growth tests on various compositions using various solvents. The compositions which are specifically disclosed in JP 2000-264790-A1 are ones in which the transition metal element is Mo, Cr, or Co. In the case of Co, when expressing the molar concentration of Co as [Co] and the molar concentration of Si as [Si], it is reported that the value of [Co]/([Co]+[Si]) is preferably approximately 0.30.

As described above, in recent years, there has been a demand in industry to increase the size of SiC single crystals, but the larger crystals become, the more markedly appear defects such as inclusions, pits, and nonuniformity of the crystal thickness. Therefore, it has been thought difficult to stably produce a SiC single crystal with a size of at least one inch which does not have inclusions or pits and has a uniform growth thickness at a high growth rate of at least 100 μm per hour by the solution growth method.

In order to realize mass production of SiC single crystals, there is a need to determine an alloying element which can form a Si alloy having a high solubility for carbon in order to make high speed growth possible, which is available relatively readily, and which can be stably used.

DISCLOSURE OF THE INVENTION

This invention provides a method for producing a SiC single crystal which makes it possible to produce a good quality SiC single crystal containing no inclusions inside it at a high speed. It is anticipated that the present invention will make it possible to realize commercial production of good quality SiC single crystals which are grown by the solution growth method, which in the past has been thought difficult to make practicable.

The present invention is a method for producing a SiC single crystal comprising immersing a seed crystal for SiC growth secured to a seed shaft in a melt contained in a rotating crucible, the melt comprising (1) Si and C or (2) Si, C, and at least one metal M and containing SiC dissolved therein, and growing a SiC single crystal on the seed crystal by creating a supersaturated SiC concentration in the melt at least in the periphery of the seed crystal, characterized in that the melt is stirred by periodically changing the rotational speed (number of revolutions) or the rotational speed and the rotational direction of the crucible.

There is no particular restriction on a means for "creating a supersaturated SiC concentration in the melt at least in the periphery of the seed crystal", and any means which can generally be used in the solution growth method can be employed. Examples of such a means include the above-described (1) slow cooling method in which the entirety of a melt is gradually cooled substantially uniformly to achieve a supercooled state (namely, to form a supersaturated solution) and (2) the temperature difference method (temperature gradient method) in which a melt is provided with a temperature gradient so that the periphery of a seed crystal becomes a lower temperature region and just the melt in this lower temperature region is supercooled to create a supersaturated state of the SiC concentration, as well as (3) the vaporization method in which a solvent is evaporated and the entirety of the melt is made a supersaturated solution.

Even in the slow cooling method, it is possible to continue growth of a SiC single crystal on a seed crystal by repeating heating and cooling of the melt after completing cooling of the melt at a temperature higher than the solidus temperature of the melt and thereby obtain a bulk single crystal. However, since repeated heating and cooling consumes a large amount of thermal energy, the temperature difference method is advantageous for growing a bulk single crystal. The slow cooling method is suitable for producing an epitaxial thin film single crystal in a batch process by completing the growth after cooling the melt one time to a temperature higher than the solidus temperature. The vaporization method is also suitable for producing a thin film single crystal.

The temperature difference method is suitable for obtaining a bulk single crystal, since crystal growth is continuously carried out in this method. However, it is also possible to obtain an epitaxial film with the temperature difference method by using a short growth time.

In each of these methods, carbon (C) can be supplied to the melt by, for example, (1) a method in which a crucible for housing the melt is made of carbon (such as a graphite crucible) and carbon is supplied by dissolving the crucible, (2) a method including blowing a hydrocarbon gas or the like, and (3) a method in which a solid source of carbon is put into the melt and dissolved therein. It is also possible to combine two or more of these methods. When employing method (3), it is preferable to start growth of a single crystal after continuing heating sufficiently long to completely dissolve the solid source of carbon. If an undissolved source of carbon is present in the melt, SiC crystals may also precipitate on it, so SiC is unnecessarily consumed, and the rate of growth of a single crystal decreases.

The melt temperature at the start of single crystal growth (the temperature of the higher temperature region of the melt in the temperature difference method, or the temperature of the melt before the start of slow cooling in the slow cooling method) is preferably at most 2000° C. In addition, the melt temperature is made higher than the liquidus temperature of the melt composition. Accordingly, the melt temperature can be selected in accordance with the alloy composition of the melt The melt temperature is more preferably 1600.-1900° C.

In the slow cooling method, the cooling rate is preferably 1-6° C. per minute and more preferably 2-5° C. per minute. The temperature gradient of the melt in the temperature difference method is preferably 5-100° C. per centimeter and more preferably 5-50° C. per centimeter. The temperature of the melt at the completion of cooling in the slow cooling method or the melt temperature of the lower temperature region in the vicinity of the substrate in the temperature difference method is preferably at least 1450° C. and more preferably 1500-1800° C.

When the melt comprises Si and C and at least one metal M, namely, when the solvent of the SiC solution is an alloy of Si and M, the type of metal M and its atomic ratio to Si are selected such that the melt of a Si-M alloy formed by melting Si and M gives a liquid phase which is in thermodynamical equilibrium state with SiC (solid phase). In general, the metal M is selected from transition metals, Al, and rare earth elements. The metal M may be one element or two or more elements.

A preferred Si-M alloy is one for which a melt of the alloy has a high solubility for carbon and for which the Si-M-C ternary alloy resulting from dissolution of carbon has a steep liquidus curve and causes SiC to crystalize as the primary crystal. Such a melt allows a SiC crystal to efficiently grow from a liquid phase, and it can achieve a higher crystal growth rate than when the solvent is solely Si.

Examples of such a Si alloy are alloys of Si with Ti, Mn, Fe, or Co. Namely, it is a Si alloy in which M is selected from Ti, Mn, Fe, and Co. When the composition of this Si alloy is expressed as $Si_{1-x}M_x$, the value of x is preferably in the following ranges:

when $M=Ti$: $0.1 \leq x \leq 0.25$,
when $M=Mn$: $0.1 \leq x \leq 0.7$,
when $M=Fe$: $0.2 \leq x \leq 0.7$, and
when $M=Co$: $0.05 \leq x \leq 0.25$ The atomic ratio between Si and M does not change even after carbon is dissolved in the melt. Accordingly, after carbon has been dissolved and the melt has become a SiC solution, when expressing the molar concentration of M in the melt as [M] and the molar concentration of Si as [Si], the value of [M]/([M]+[Si]) is preferably in the following ranges:

when M=Ti, at least 0.1 and at most 0.25,
when M=Mn, at least 0.1 and at most 0.7,
when M=Fe, at least 0.2 and at most 0.7, and
when M=Co, at least 0.05 and at most 0.25

In any of these cases, when the proportion of the metal M is too small, the concentration of C which dissolves in the alloy melt (and accordingly the SiC concentration of the solution which is formed) decreases, and thereby the growth rate of a SiC crystal decreases. On the other hand, if the amount of M becomes too large, a carbide of the metal M begins to crystallize, thereby impeding the growth of SiC, decreasing the growth rate, causing the thickness of the film which is grown to become nonuniform, and deteriorating the quality of the resulting crystal.

The value of [M]/([M]+[Si]) is more preferably in the following ranges:

when M=Ti, at least 0.15 and at most 0.20,
when M=Mn, at least 0.4 and at most 0.6,
when M=Fe, at least 0.4 and at most 0.6, and
when M=Co, at least 0.07 and at most 0.18

The growth rate of a SiC single crystal increases particularly when M is Fe or Co.

When carbon is to be supplied by dissolving the crucible, a carbonaceous crucible typified by a graphite crucible is used as the crucible. When carbon is supplied by addition of a carbon source, a crucible made from a crucible material which is stable at the temperature of growth of SiC, e.g., a high melting metal such as Ta, W, or Mo, or a crucible made from a graphite crucible lined with a suitable refractory material (such as the above-described high melting metal or a ceramic) can be used.

After a melt (SiC solution) in which SiC is dissolved to reach a saturated concentration or close thereto in a solvent comprising Si or a Si-M alloy is prepared, a seed crystal for SiC growth is immersed in the melt, and a supersaturated concentration of SiC is created in the melt at least in the vicinity of the seed crystal, whereby SiC is grown on the seed crystal.

The seed crystal may be SiC obtained by the sublimation method or a SiC single crystal obtained by vapor phase growth such as the CVD method. The crystal structure of the seed crystal is the same as that of the SiC single crystal to be grown thereon. The seed crystal is not limited to a SiC single crystal. As a seed crystal, it is also possible to use a single crystal of a different material having the same crystal structure, such as a silicon single crystal, on which heteroepitaxial growth of SiC can take place and which can stably exist in a melt.

The seed crystal can be attached to the end of a rotatable seed shaft (a supporting jig for a seed crystal) which extends through a lid of the crucible and be immersed in the melt. In the temperature difference method, the seed crystal is usually positioned in the melt in the vicinity of the free interface (the liquid level of the melt. In the slow cooling method or the vaporization method in which the SiC concentration of the entire melt is made supersaturated, the seed crystal can be positioned in any location.

The present invention employs the so-called accelerated crucible rotation technique (ACRT) in the production of a SiC single crystal by the solution growth method. As a result, the stirring effect inside the melt is enhanced, the occurrence of inclusions is prevented, and at the same time, an unexpected speedup in crystal growth is achieved.

ACRT is a method for growing a single crystal from a melt in a crucible in which the rotational speed or the rotational speed and the rotational direction of the crucible which is a vessel are changed, namely, acceleration is changed. This method was proposed by Sheel and Schultz-duBois (J. Crystal Growth, 8 (1971) 304), and the technique itself is known, However, up to the present time, ACRT has not been applied to growth of a SiC single crystal by the solution growth method, and it has not been thought effective for solving the above-described various problems. The present invention for the first time combines ACRT with growth of a SiC single crystal by the solution growth method. It was found that as a result of this combination, a totally unexpected and significant effect is achieved which could not in any way be predicted from SiC single crystal growth by the solution growth method and ACRT by themselves (specifically, not only is the formation of inclusions prevented, but the crystal growth rate is markedly increased).

In the accelerated crucible rotation technique (ACRT), when only the rotational speed of a crucible is periodically varied, the variation in the rotational speed can be carried out by making (1) accelerating up to a first set rotational speed A1,
(2) maintaining rotation at the first rotational speed A1, and
(3) decelerating to a second set rotational speed A2 (A2<A1) one cycle, and repeating this cycle (in each cycle, it is not necessary for the set value of each of rotational speeds A1 and A2 to be the same or fixed, and the set value can be varied from one cycle to another).

When both the rotational speed and rotational direction of the crucible are periodically varied, this variation can be carried out by making (1) accelerating up to a first set rotational speed B1 in a first rotational direction,
(2) maintaining rotation in the first rotational direction at rotational speed B1,
(3) decelerating to a rotational speed of 0 rpm,
(4) accelerating to a set rotational speed B2 in a second rotational direction which is in the opposite direction (B2 may be the same as or different from B1),
(5) maintaining rotation at set value B2 in the second rotational direction, and
(6) decelerating to a rotational speed of 0 rpm one cycle, and repeating this cycle (in each cycle, the set value of each of rotational speeds B1 and B2 needs not be the same or fixed, and the set value can be varied from cycle to cycle).

The higher are the set rotational speeds A1, B1, and B2, the greater is the stirring effect in the melt which can be expected, but if a rotational speed is too high, the shape of the melt surface may become unstable thereby adversely affecting the crystal growth. A preferred range for A1, B1, and B2 is in the range of 15-100 rpm. It is sufficient for set rotational speed A2 to be smaller than A1, and it may be 0 rpm. A preferred range for A2 is from 0 rpm to ½ of A1.

When varying only the rotational speed, preferably (1) the duration of acceleration until the first rotational speed A1 is reached is 1 second to 10 minutes,
(2) the length of time for which rotation is maintained at the first set rotational speed A1 is 0 seconds to 10 minutes, and
(3) the duration of deceleration from the completion of maintaining rotation at A1 until the second set rotational speed A2 is reached is 1 second to 10 minutes.

If the duration of acceleration up to A1 is shorter than 1 second, it is difficult to perform acceleration, while if it is longer than 10 minutes, the rate of acceleration is so small that the forced stirring effect is decreased. The longer the lo holding time at A1, the greater the stirring effect which is obtained, but if it is longer than 10 minutes, the stirring effect decreases. The holding time may be instantaneous, i.e., it may be substantially 0 seconds. The duration of deceleration from A1 to A2 is preferably in the above-described range for the same reasons given for the duration of acceleration to A1. At the time of this deceleration, a is large forced stirring effect is obtained in the same manner as at the time of acceleration.

In the method in which both the rotational speed and the rotational direction are varied, for the same reasons as for the above-described method, preferably (1) the duration of acceleration until the first set rotational speed B1 in the first direction is reached is 1 second to 10 minutes,
(2) the length of time for which rotation is maintained at the set rotational speed B1 in the first direction is 0 seconds to 10 minutes,
(3) the duration of deceleration from the completion of maintaining rotation in the first direction until 0 rpm is reached is 1 second to 10 minutes,
(4) the duration of acceleration until the set rotational speed B2 in the second direction is reached is 1 second to 10 minutes,
(5) the length of time for which rotation is maintained at the set rotational speed B2 in the second direction is 0 seconds to 10 minutes, and
(6) the duration of deceleration from the completion of maintaining rotation in the second direction until 0 rpm is reached is 1 second to 10 minutes.

In the latter method, the stirring effect inside the melt is increased compared to the former method by the reversal of rotational direction.

In the method according to the present invention, stirring inside a melt is promoted by accelerated rotation of a crucible. In addition, a seed shaft (a jig for holding a seed crystal) to which a seed crystal is attached may be rotated in the same rotational direction as the crucible or in the opposite direction. Rotation of the seed shaft is preferably accelerated rotation synchronized with the rotation of the crucible. As a result, stirring inside the melt can be further increased.

As stated above, inclusions which are defects of a SiC single crystal include gas bubbles. In order to prevent gas bubbles from being incorporated into a SiC single crystal, it is effective to lower the viscosity of the gas atmosphere in the crucible during SiC growth. If the viscosity of the gas atmosphere is too high, gas bubbles which form inside the melt tend to easily remain at the SiC crystal growth interface on the surface of the seed crystal substrate, and as crystal growth proceeds, it is enclosed inside the SiC single crystal and becomes inclusions.

Specifically, by making the viscosity $\eta$ (eta) of the gas atmosphere at the is temperature of single crystal growth such that $\eta \leq 750$ μP, gas bubbles can be prevented from being incorporated into a SiC single crystal. In the slow cooling method, the single crystal growth temperature is different at the start of cooling and at the completion of cooling, but the viscosity $\eta$ of the gas atmosphere is made at most 750 μP over the entire temperature range The gas viscosity increases as the temperature decreases, so it is sufficient if $\eta$ is at most 750 μP at the temperature at the completion of cooling.

The gas atmosphere can be constituted by one or more nonoxidizing gases in order to prevent oxidation of the SiC single crystal being grown. Examples of nonoxidizing gases include noble gases such as He, Ne, and Ar, nitrogen gas, hydrogen gas, and hydrocarbon gases such as methane.

The viscosity η of the gas atmosphere varies based on a combination of the particular gas or gases, the gas pressure, and the temperature, and the composition and the pressure of the nonoxidizing gas are selected so that the viscosity η of the gas at the temperature of single crystal growth is at most 750 μP. For example, a gas such as Ar having a high molecular weight has a relatively high viscosity, and it is difficult to satisfy the above-described viscosity requirement using Ar alone.

Making the viscosity η of the gas atmosphere as low as possible is advantageous for the purpose of suppressing gas bubbles. The viscosity of hydrogen gas, which has the lowest gas viscosity, ranges from 250 μP (at 1500° C.) to 300 μP (at 2000° C.). However, taking into consideration that hydrogen gas poses a danger of exploding, a noble gas such as He is easier to use from an industrial standpoint. Incorporation of gas bubbles into a SiC single crystal can be prevented with certainty by using He alone or a He-based mixed gas, for example.

If the pressure of the gas atmosphere is a negative pressure (reduced pressure), the melt will heavily evaporate. Therefore, the pressure is preferably atmospheric pressure or higher. A more preferred pressure of the gas atmosphere is in the range of approximately 0.1-1 MPa.

When blowing a hydrocarbon gas such as methane into the melt as a source of C, this gas may also constitute the gas atmosphere. In this case, if necessary, after the completion of blowing, the gas atmosphere can be replaced by another non-oxidizing gas so that the viscosity of the gas atmosphere during single crystal growth will satisfy the above-described requirements.

In a method according to the present invention, by applying ACRT to growth of a SiC single crystal by the solution growth method and preferably controlling the viscosity of a gas atmosphere, a good quality SiC single crystal having no inclusions inside the crystal and having a size of at least 1 inch in diameter and at least 5 micrometers in thickness can be stably produced with a reliably high crystal growth rate. Thus, high speed growth of a high quality SiC single crystal by the solution growth method, which was thought to be difficult to achieve in the past, can be realized.

In general, when the thickness of a single crystal is less than 200 micrometers, the single crystal is used in the form of a thin film epitaxially grown on a seed substrate of a SiC single crystal. When the thickness of the single crystal is at least 200 micrometers, it can be used as a substrate material for devices after the seed crystal is removed, if necessary. Thus, a single crystal produced by the present invention can be used as a bulk single crystal for use as a substrate, or as an epitaxial film for a device on the seed crystal as a substrate.

BEST MODE FOR CARRYING OUT THE INVENTION

Figure 2:
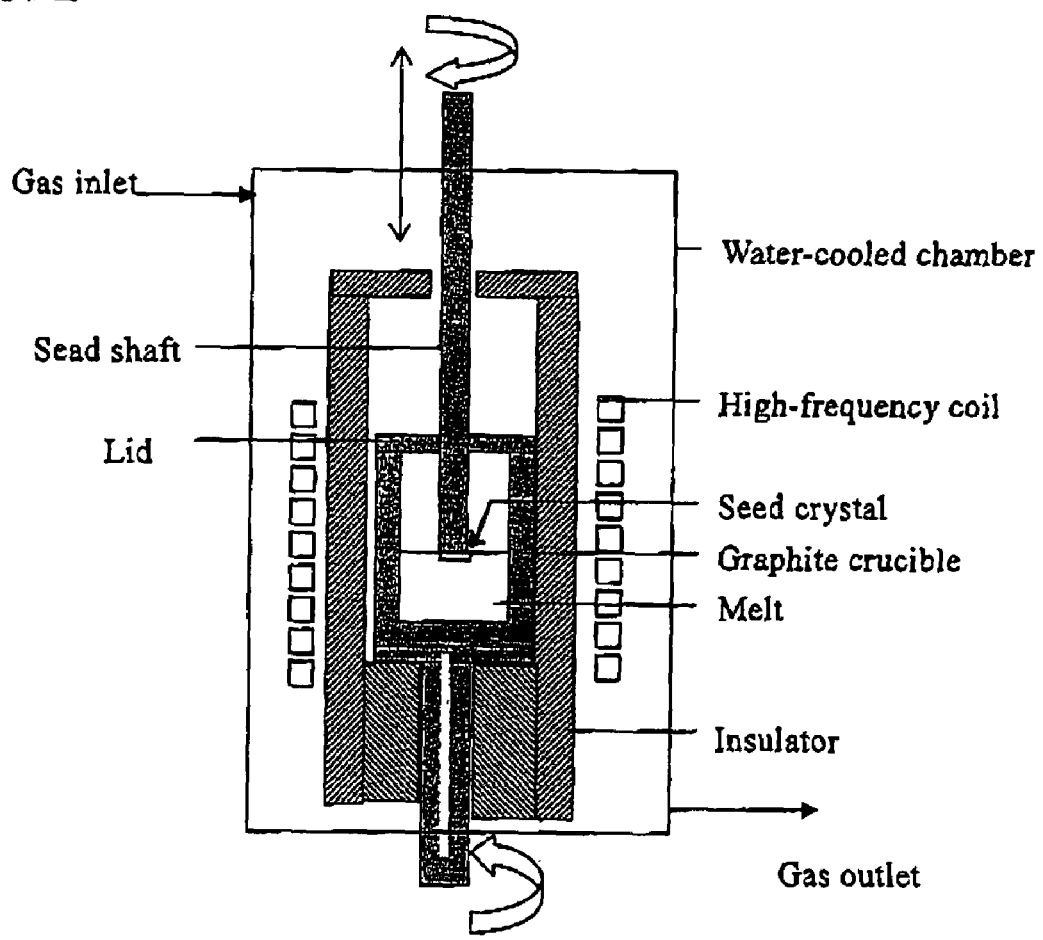
FIG. 2 is a schematic explanatory view of an apparatus for growing a single crystal by the solution growth method suitable for use in the method of the present invention.

In the below-described examples, experiments were carried out using a crystal growth apparatus as shown in FIG. 2. The illustrated apparatus has a rotatable, high-purity graphite crucible which contains a SiC solution (a melt in which SiC is dissolved) at a high temperature. The graphite crucible used in the examples has an inner diameter of 80 mm and a height of 150 mm. A seed crystal which is attached to a rotatable seed shaft which extends through a crucible cover and is inserted into the crucible is immersed in the SiC solution in the crucible. The graphite crucible is enveloped by a thermal insulator, and a heating coil for high frequency induction heating is installed around the thermal insulator. All of the above elements are housed inside a water-cooled chamber. The water-cooled chamber has a gas inlet and a gas outlet so that the composition and the pressure of a gas atmosphere during crystal growth can be controlled. Although not shown in the drawing, the temperature of the side of the graphite crucible is directly measured by a pyrometer, such as a two-wave pyrometer, located on the back side of the crucible. A plurality of pyrometers may be installed along the height of the crucible so that the melt temperature may be measured at different positions in the vertical direction.

In the experiments, the graphite crucible is charged with Si or Si and an alloying metal M as a solvent, and an electric current is passed through the high frequency coils to melt the charged material by high frequency induction heating, thereby forming a melt. Carbon (C) is supplied to the melt by dissolving the high-purity graphite crucible which is the vessel. By adjusting the relative positions of the graphite crucible and the high frequency coil, it is possible to create a state of uniform heating or a suitable temperature gradient inside the melt. Accordingly, the illustrated apparatus can carry out SiC crystal growth by either the slow cooling method or the temperature difference method.

At least just before the seed crystal is immersed in the solution, the crucible and the seed shaft each begin accelerated rotation, and accelerated rotation is carried out when the seed crystal is immersed and a new SiC crystal is growing on the seed crystal.

Although the examples illustrate growth experiments by the temperature difference method, the same results can be obtained by the slow cooling method.

Operation of the Examples are as Follows.

The graphite crucible was charged with the raw material which was Si or Si and M, and after the raw material was heated to a predetermined temperature and melted, heating of the resulting melt was continued to dissolve carbon from the crucible into the melt. After heating was continued until the concentration of the resulting SiC solution reached saturation or the vicinity thereof (such as for 5 hours), the seed crystal was immersed in the vicinity of the level of the SiC solution. Before immersing the seed crystal, the heating temperature was adjusted so as to create a temperature gradient in which the temperature in the vicinity of the level of the solution where the seed crystal was located was lower than the temperature of the lower portion of the solution. This adjustment of the heating temperature can be made immediately after the start of heating or in the course of heating. In the examples, heating was carried out such that a temperature gradient was created immediately after the start of heating.

The seed crystal used in the examples was a SiC single crystal (6H—SiC, (0001) on-axis, Si face) with a diameter of 1 inch produced by the sublimation method. After immersion of the seed crystal (growth of a SiC crystal) was continued for 5 hours, the seed crystal which was pulled out of the melt was washed with $HF+HNO_3$ to remove a deposit of solidified melt. The thickness of the SiC single crystal which was newly grown on the seed crystal was measured using an optical photomicrograph (×200) of a cross section of the seed crystal, and the thickness was divided by the duration of growth (5 hours) to determine the growth rate. The occurrence of inclusions inside the single crystal which was grown was investigated using the optical photomicrograph of the cross section and an optical photomicrograph (×200) of the surface of the SiC single crystal. At a magnification of ×200, it is possible to distinguish inclusions on the micrometer order, The growth rate was ranked in the following manner relative to the growth rate in a comparative example using the same raw material composition without applying ACRT:

⊚: a growth rate at least 2 times the comparative example,
◯: greater than 1 time and less than 2 times,
X: less than 1 time.

Inclusions were ranked as follows based on whether there were inclusions in the entire area of the grown crystal:
◯: inclusions not observed,
X: inclusions observed.

Evaluation of inclusions was carried out in the above-described manner for the two types of inclusions: inclusions caused by incorporation of the solvent into the crystal (foreign matter) and gas bubbles which are inclusions caused by incorporation of the gas atmosphere into the crystals. These inclusions not only have different shapes from each other (the cross section is circular for gas bubbles while it has an irregular shape for foreign matter), but they also markedly differ with respect to light transmittance, so they can easily be distinguished by observation with an optical microscope.

The test results are shown in Table 1 together with the composition of the raw material which was charged into the graphite crucible, the rotating conditions of the crucible and the seed shaft, and the gas atmosphere and its viscosity (the value at the temperature of the lower temperature region of the melt).

From these results, it was found that by applying the accelerated crucible rotation technique (ACRT) to the solution growth method for SiC single crystal, large single crystals with a diameter of at least 1 inch which are free from inclusions can be grown, whereas in the conventional solution growth method, growth of inclusion-free crystals could only be realized with extremely small crystals measuring on the order of a several millimeter square.

This is thought to be because accelerated rotation of a crucible produces forced flowing of the melt, thereby promoting uniform supply of the solute to the seed crystal. As a result, it is presumed that nonuniform supply of the solute to the growth interface is markedly improved so that step bunching is suppressed, thereby making it possible to completely suppress incorporation of the solvent between steps and prevent the occurrence of inclusions caused thereby.

It was also found that uniform supply of the solute to the growth interface allows the resulting grown crystal to have a significantly improved distribution of in-plane thickness. In addition, it was ascertained that supply of the solute by forced flowing results in a increase in the crystal growth rate by a factor of at least two compared to growth not employing ACRT in crystal growth in which the transport of a solute to the growth interface becomes a rate-determining step, as is the case with SiC. It was also ascertained that a SiC single crystal obtained by applying ACRT maintains a surface morphology of a mirror surface when observed visually even in the case where it is grown to a crystal length on the centimeter order. This is because uniform step flow growth on the atomic level is realized with a large surface area.

Up to now, it had not been known that ACRT not only prevents inclusions but also brings about a marked increase in crystal growth rate and an improvement in surface morphology, and it is a surprising effect peculiar to the growth of a SiC single crystal. This is because, as stated above, the solubility of SiC as a solute is extremely low, and supply of the solute to the growth interface is markedly increased by creating a forced flow.

As a method of creating a forced flow in a melt, both a first method in which only the rotational speed of a graphite crucible is varied (the one direction rotation method) and a second method in which the rotational speed and rotational direction of a graphite crucible are varied (the back and forth rotation method) were carried out In the first method,
(1) accelerating to a first set rotational speed A1,
(2) maintaining rotation at the first rotational speed A1, and
(3) decelerating to a second set rotational speed A2 (A2<A1) were made one cycle, which was repeatedly performed.

In the second method,
(1) accelerating in a first rotational direction to a set rotational speed B1,
(2) maintaining rotation at rotational speed B1,
(3) decelerating to a rotational speed of 0 rpm,
(4) accelerating in a second rotational direction which is the opposite direction to a set rotational speed B2 (B2 may be different from B1, but in the experiments, it was the same),
(5) maintaining rotation at the set value B2, and
(6) decelerating to a rotational speed of 0 rpm were made one cycle, which was repeatedly performed.

Stirring of the inside of the melt was promoted by accelerated rotation of the crucible, but in some of the examples, in order to firer increase stirring, the seed shaft on which a seed crystal was mounted was made to undergo accelerated rotation which was synchronized with the crucible rotation.

EXAMPLE 1

This example illustrates application of ACRT in which only a graphite crucible is rotated in back and forth.

A graphite crucible was charged with Si and Ti as an alloy raw material (for forming a solvent for SiC) in proportions corresponding to a composition of $Si_{0.80}Ti_{0.20}$ ([M]/([M]+[Si])=0.20), and after the atmosphere inside the apparatus was replaced with argon gas, the raw material was heated to melt. Heating of the melt was adjusted such that the temperature in the vicinity of the level of the melt which became a crystal growth interface was approximately 1700° C. and the temperature at the bottom of the melt was approximately 1750° C. The crucible was rotated from the start of heating. Heating of the melt was continued for two hours so that a sufficient amount of carbon was dissolved from the crucible into the melt to achieve a saturated SiC concentration, and then a SiC seed crystal attached to a seed shaft was immersed just below the level of the melt.

In this example, only the crucible was rotated, without rotating the seed crystal and the seed shaft. The final rotational speed of the crucible was set at 30 rpm, and the time to reach the set rotational speed was 5 seconds. The crucible was first rotated to the left, and after the rotational speed reached the set rotational speed, rotation at this rotational speed was continued for 10 seconds, and then rotation was stopped in 5 seconds. Next, the rotational direction of the crucible was changed to the right, and in the same manner as described above, 30 rpm was reached in 5 seconds, rotation at 30 rpm was continued for 10 seconds, and then rotation was stopped in 5 seconds. The above procedure was made one cycle (cycle time of 40 seconds), and this cycle was repeated during crystal growth.

When 5 hours had elapsed after immersion of the seed crystal, the seed shaft was lifted such that the crystal was pulled away from the melt to terminate growth, and rotation of the crucible was stopped. After the crucible was gradually cooled to room temperature, the crystal was recovered from the seed shaft. A new SiC single crystal had grown on the seed crystal, and it had a growth area which was the same 1-inch diameter as the seed crystal.

EXAMPLE 2

This example illustrates growth of a SiC single crystal by ACRT in which a graphite crucible and a seed crystal (seed shaft) are rotated with back-and-forth rotation in such a manner that they have the same rotational direction.

The seed crystal and the crucible were first both rotated to the left. The final rotational speed of the seed crystal and the crucible was set at 30 rpm, and the time until the set rotational speed was reached was 5 seconds. After the final rotational speed was reached, rotation was carried out at this rotational speed for 10 seconds, and then rotation was stopped in 5 seconds. Next, the rotational direction of the seed crystal and the crucible was changed to the right, and in the same manner as described above, it reached 30 rpm in 5 seconds, and after rotation was maintained at 30 rpm for 10 seconds, rotation was stopped in 5 seconds. The above procedure was made one cycle (cycle time of 40 seconds), and this cycle was repeated during crystal growth. The back and forth rotation was repeated while rotation of the seed shaft and that of the crucible are always synchronous with each other in the same rotational direction.

A SiC crystal was grown by the solution growth method in the same manner as in Example 1 except for the above-described rotational conditions, When 5 hours had elapsed after immersion of the seed crystal, the seed shaft was lifted such that the crystal was pulled away from the melt to terminate growth. Rotation of the seed shaft and the crucible was then stopped. After the crucible was gradually cooled to room temperature, the crystal was recovered from the seed shad. A new SiC single crystal had grown on the seed crystal, and it had a growth area which was the same 1-inch diameter as the seed crystal.

EXAMPLE 3

This example illustrates growth of a SiC single crystal by ACRT in which a graphite crucible and a seed crystal (seed shaft) are rotated with back-and-forth rotation in such a manner that their rotational directions are opposite from each other.

Figure 3:
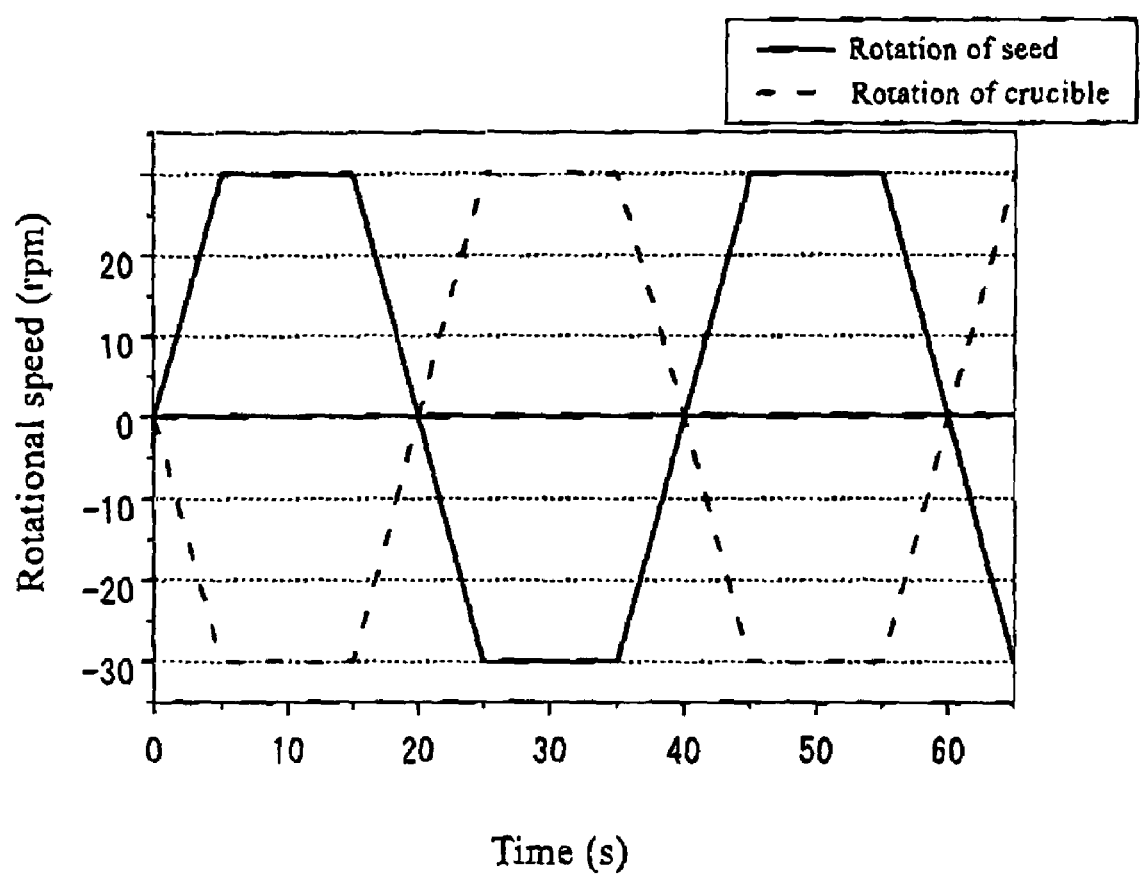
FIG. 3 is a diagram showing the profile of rotation of a crucible and a seed shaft used in an example of the present invention.

Thus, the seed crystal was first rotated to the right, while the crucible was rotated to the left. The final rotational speed for each was set at 30 rpm, and the time to reach the set rotational speed was 5 seconds. After the set rotational speed was reached, rotation was continued at that rotational speed for 10 seconds, and then rotation was stopped in 5 seconds. Next, the rotational directions were reversed such that the seed shaft was rotated to the left and the crucible was rotated to the right. In the same manner as described above, after 30 rpm was reached in 5 seconds, rotation was continued at 30 rpm for 10 seconds, and then rotation was stopped in 5 seconds. The above procedure was made one cycle, and this cycle was repeated during crystal growth. The rotation of the seed shaft and the crucible was carried out so that the rotational directions were always the opposite of each other while synchronized back and forth rotation was repeated. This state is shown in FIG. 3. As shown in this figure, the length of one cycle was 40 seconds.

A SiC crystal was grown by the solution growth method in the same manner as in Example 1 except for the above-described rotational conditions. When 5 hours had passed after immersion of the seed crystal, the seed shaft was lifted such that the crystal was pulled away from the melt to terminate growth. Rotation of the seed shaft and the crucible was then stopped. After the crucible was gradually cooled to room temperature, the crystal was recovered from the seed shaft. A new SiC single crystal had grown on the seed crystal, and it had a growth area which was the same 1-inch diameter as the seed crystal.

EXAMPLE 4

This example illustrates growth of a SiC single crystal by ACRT in which the rotational directions of a graphite crucible and a seed crystal (seed shaft) are the same so that acceleration and deceleration are repeated while maintaining the same rotational direction without reversing the rotational direction.

A seed crystal (seed shaft) and a crucible were both rotated to the left, and the final rotational speed of each was set to 30 rpm. The time until the set rotational speed was reached was 5 seconds. After the final rotational speed was reached, rotation was continued at this rotational speed for 10 seconds, and then deceleration was carried out for 5 seconds to a rotational speed of 0 rpm (namely, rotation was stopped). After the stop of rotation, acceleration was immediately carried out to the left as before to 30 rpm in 5 seconds, and after rotation at 30 rpm was maintained for 10 seconds, rotation was stopped in 5 seconds. In this example, acceleration to 30 rpm, maintaining rotation at 30 rpm, and deceleration to 0 rpm constituted one cycle, and the time for one cycle was 20 seconds. Rotation of the seed shaft and the crucible was always synchronized in the same rotational direction.

A SiC crystal was grown by the solution growth method in the same manner as in Example 1 except for the above-described rotational conditions. When 5 hours had passed after immersion of the seed crystal, the seed shaft was lifted such that the crystal was pulled away from the melt to terminate growth. Rotation of the seed shaft and the crucible was then stopped. After the crucible was gradually cooled to room temperature, the crystal was recovered from the seed shaft. A new SiC single crystal had grown on the seed crystal, and it had a growth area which was the same 1-inch diameter as the seed crystal.

EXAMPLE 5

A graphite crucible was charged with Si and Mn in proportions corresponding to a composition of $Si_{0.40}Mn_{0.60}$ ($[M]/([M]+[Si])=0.60$), and after the atmosphere inside the apparatus was replaced by argon gas, the content of the crucible was heated to melt. In the same manner as in Example 3, growth of a SiC single crystal was carried out by ACRT in which the graphite crucible and a seed crystal (seed shaft) were rotated with back and forth rotation in such a manner that their rotational directions were opposite from each other.

Heating of the melt was adjusted such that the temperature in the vicinity of the liquid level, which was the crystal growth interface, was approximately 1600° C. and the temperature at the bottom of the melt was 1650° C. Rotation of the crucible and the seed shaft was to carried out from the start of heating of the melt. After heating of the melt was continued for two hours so that carbon had sufficiently dissolved from the crucible into the melt, a SiC seed crystal attached to the seed shaft was immersed immediately below the liquid level of the melt to commence crystal growth. When hours had passed after immersion of the seed crystal, the seed shaft was lifted such that the crystal was pulled away from the melt to terminate growth. Rotation of the seed shaft and the crucible was then stopped. After the crucible was gradually cooled to room temperature, the crystal was recovered from the seed shaft. A new SiC single crystal had grown on the seed crystal, and it had a growth area which was the same 1-inch diameter as the seed crystal.

EXAMPLE 6

A SiC single crystal was produced on a seed crystal in the same manner as in Example 1 except that the graphite crucible was charged with Si alone. Namely, a seed shaft was not rotated, and only a graphite crucible was rotated back and forth. In the preceding examples, the solvent (the raw material charged into the crucible) was a Si—Ti alloy, but in this example it was Si.

When 5 hours had passed after immersion of the seed crystal, the seed shaft was lifted such that the crystal was pulled away from the melt to terminate growth. Rotation of the crucible was then stopped. After the crucible was gradually cooled to room temperature, the crystal was recovered from the seed shaft. A new SiC single crystal had grown on the seed crystal, and it had a growth area which was the same 1-inch diameter as the seed crystal.

As shown in Table 1, in this example, the rate of crystal growth was lower than in Examples 1-4. This was because the solvent of the SiC solution was a Si—Ti alloy in Examples 1-4, whereas it was just Si in this example, and the SiC concentration in the solution was lower. Nevertheless, compared to Comparative Example 3 in which the solvent was just Si and accelerated rotation was not carried out, the crystal growth rate in this example was at least 3 times as high.

EXAMPLE 7

A graphite crucible was charged with Si and Fe in proportions corresponding to a composition of $Si_{0.90}Fe_{0.10}$ ([M]/([M]+[Si])=0.10), and a SiC crystal was grown in the same manner as in Example 3 by ACRT in which the graphite crucible and a seed crystal (a seed shaft) were rotated back and forth in opposite rotational directions from each other. The heating conditions for the melt were also the same as in Example 3.

When 5 hours had passed after immersing the seed crystal, the seed shaft was lifted such that the crystal was pulled away from the melt to terminate growth. Rotation of the crucible was then stopped. After the crucible was gradually cooled to room temperature, the crystal was recovered from the seed shaft. A new SiC single crystal had grown on the seed crystal, and it had a growth area which was the same 1-inch diameter as the seed crystal.

EXAMPLE 8

A graphite crucible was charged with Si and Fe in proportions corresponding to a composition of $Si_{0.45}Fe_{0.55}$ ([M]/([M]+[Si])=0.55), and a SiC single crystal was grown in the same manner as in Example 3 by ACRT in which the graphite crucible and a seed crystal (seed shaft) were rotated back and forth in opposite rotational directions from each other. The heating conditions for the melt were also the same as in Example 3.

When 5 hours had passed after immersion of the seed crystal, the seed shaft was lifted, and the crystal was pulled away from the melt to terminate growth. Rotation of the crucible was then stopped. After the crucible was gradually cooled to room temperature, the crystal was recovered from the seed shaft. A new SiC single crystal had grown on the seed crystal, and it had a growth area which was the same 1-inch diameter as the seed crystal.

EXAMPLE 9

A graphite crucible was charged with Si and Fe in proportions corresponding to a composition of $Si_{0.30}Fe_{0.70}$ ([M]/([M]+[Si])=0.70), and a SiC single crystal was grown in the same manner as in Example 3 by ACRT in which the graphite crucible and a seed crystal (a seed shaft) were rotated back and forth in opposite rotational directions from each other. The heating conditions for the melt were also the same as in Example 3.

When 5 hours had passed after immersion of the seed crystal, the seed shaft was lifted such that the crystal was pulled away from the melt to terminate growth. Rotation of the crucible was then stopped. After the crucible was gradually cooled to room temperature, the crystal was recovered from the seed shaft A new SiC single crystal had grown on the seed crystal, and it had a growth area which was the is same 1-inch diameter as the seed crystal.

EXAMPLE 10

Si and Co were charged into a graphite crucible in proportions corresponding to a composition of $Si_{0.95}Co_{0.05}$ ([M]/([M]+[Si])=0.05), and a SiC single crystal was grown in the same manner as in Example 3 by ACRT in which the graphite crucible and a seed crystal (a seed shaft) were rotated back and forth in opposite rotational directions from each other. The heating conditions for the melt were also the same as in Example 3.

When 5 hours had passed after immersion of the seed crystal, the seed shaft was lifted such that the crystal was pulled away from the melt to terminate growth. Rotation of the crucible was then stopped. After the crucible was gradually cooled to room temperature, the crystal was recovered from the seed shaft, A new SiC single crystal had grown on the seed crystal, and it had a growth area which was the same 1-inch diameter as the seed crystal.

EXAMPLE 11

Si and Co were charged into a graphite crucible in proportions corresponding to a composition of $Si_{0.90}Co_{0.10}$ ([M]/([M]+[Si])=0.10), and a SiC single crystal was grown in the same manner as in Example 3 by ACRT in which the graphite crucible and a seed crystal (a seed shaft) were rotated back and forth in opposite rotational directions from each other. The heating conditions for the melt were also the same as in Example 3.

When 5 hours had passed after immersion of the seed crystal, the seed shaft was lifted such that the crystal was pulled away from the melt to terminate growth. Rotation of the crucible was then stopped. After the crucible was gradually cooled to room temperature, the crystal was recovered from the seed shaft. A new SiC single crystal had grown on the seed crystal, and it had a growth area which was the same 1-inch diameter as the seed crystal.

EXAMPLE 12

Si and Co were charged into a graphite crucible in proportions corresponding to a composition of $Si_{0.65}Co_{0.35}$ ([M]/([M]+[Si])=0.35), and a SiC single crystal was grown in the same manner as in Example 3 by ACRT in which the graphite crucible and a seed crystal (a seed shaft) were rotated back and forth in opposite rotational directions from each other. The heating conditions for the melt were the same as in Example 3.

When 5 hours had passed after immersion of the seed crystal, the seed shaft was lifted such that the crystal was pulled away from the melt to terminate growth. Rotation of the crucible was then stopped. After the crucible was gradually cooled to room temperature, the crystal was recovered from the seed shaft. A new SiC single crystal had grown on the seed crystal, and it had a growth area which was the same 1-inch diameter as the seed crystal.

EXAMPLE 13

A SiC single crystal was grown in the same manner as in Example 3 except that the gas atmosphere for crystal growth was changed to a He atmosphere.

Namely, the alloy raw material with which a graphite crucible was charged was Si and Ti in proportions corresponding to a composition of $Si_{0.80}Ti_{0.20}$ ([M]/([M]+[Si])=0.20). During crystal growth, the graphite crucible and a seed crystal (seed shaft) were rotated back and forth in opposite rotational directions from each other. He (helium) gas was used from the start as the gas atmosphere.

When 5 hours had passed after immersion of the seed crystal, the seed shaft was lifted such that the crystal was pulled away from the melt to terminate growth. Rotation of the crucible was then stopped. After the crucible was gradually cooled to room temperature, the crystal was recovered from the seed shaft. A new SiC single crystal had grown on the seed crystal, and it had a growth area which was the same 1-inch diameter as the seed crystal.

EXAMPLE 14

A graphite crucible was charged with Si and Mn in proportions corresponding to a composition of $Si_{0.40}Mn_{0.60}$ ([M]/([M]+[Si])=0.60), and a SiC single crystal was grown by ACRT in the same manner as in Example 3 in which the graphite crucible and a seed crystal (seed shaft) were rotated back and forth in opposite rotational directions from each other. However, in this example, the gas atmosphere during crystal growth was changed to a helium atmosphere in the same manner as in Example 13. The heating conditions of the melt were the same as in Example 5. When 5 hours had passed after immersion of the seed crystal, the seed shaft was lifted such that the crystal was pulled away from the melt to terminate growth. Rotation of the seed shaft and the crucible was then stopped. After the crucible was gradually cooled to room temperature, the crystal was recovered from the seed shaft. A new SiC single crystal had grown on the seed crystal, and it had a growth area which was the same 1-inch diameter as the seed crystal.

EXAMPLE 15

A graphite crucible was charged with Si and Fe in proportions corresponding to a composition of $Si_{0.90}Fe_{0.10}$ ([M]/([M]+[Si])=0.10), and a SiC single crystal was grown by ACRT in the same manner as in Example 3 in which the graphite crucible and a seed crystal (seed shaft) were rotated back and forth in opposite rotational directions from each other. However, in this example, the gas atmosphere during crystal growth was changed to a He atmosphere in the same manner as in Example 13. The heating conditions of the melt were the same as in Example 3.

When 5 hours had passed after immersion of the seed crystal, the seed shaft was lifted such that the crystal was pulled away from the melt to terminate growth. Rotation of the crucible was then stopped After the crucible was gradually cooled to room temperature, a crystal was recovered from the seed shaft. A new SiC single crystal had grown on the seed crystal, and it had a growth area which was the same 1-inch diameter as the seed crystal.

EXAMPLE 16

A graphite crucible was charged with Si and Co in proportions corresponding to a composition of $Si_{0.90}Co_{0.10}$ ([M]/([M]+[Si])=0.10), and a SiC single crystal was grown by ACRT in the same manner as in Example 3 in which the graphite crucible and a seed crystal (seed shaft) were rotated back and forth in opposite rotational directions from each other. However, in this example, the gas is atmosphere during crystal growth was changed to a He atmosphere in the same manner as in Example 13. The heating conditions of the melt were the same as in Example 3.

When 5 hours had passed after immersion of the seed crystal, the seed shaft was lifted such that the crystal was pulled away from the melt to terminate growth. Rotation of the crucible was then stopped. After the crucible was gradually cooled to room temperature, the crystal was recovered from the seed shaft. A new SiC single crystal had grown on the seed crystal, and it had a growth area which was the same 1-inch diameter as the seed crystal.

COMPARATIVE EXAMPLE 1

In this example, in the same manner as in Example 3, a seed crystal and a crucible were rotated in opposite directions from each other, with the seed crystal being rotated to the right and the crucible being rotated to the left. However, the rotational speed during crystal growth was maintained at 30 rpm for both the seed crystal and the crucible, and accelerated rotation was not carried out. A SiC single crystal was grown by the solution growth method in a manner which was otherwise the same as in Example 3. The alloy raw material with which the graphite crucible was charged was Si and Ti corresponding to a composition of $Si_{0.80}T_{0.20}$ ([M]/([M]+[Si])=0.20), and the gas atmosphere during crystal growth was Ar.

When 5 hours had passed after immersion of the seed crystal, the seed shaft was lifted such that the crystal was pulled away from the melt to terminate growth. Rotation of the seed shaft and the crucible was then stopped. After the crucible was gradually cooled to room temperature, the crystal was recovered from the seed shaft. A new SiC single crystal had grown on the seed crystal, and it had a growth area which was the same 1-inch diameter as the seed crystal.

COMPARATIVE EXAMPLE 2

A graphite crucible was charged with Si and Mn in proportions corresponding to a composition of $Si_{0.40}Mn_{0.60}$ ([M]/([M]+[Si])=0.60), and in the same manner as in Comparative Example 1, the seed crystal and the crucible were rotated in opposite directions from each other, with the seed crystal being rotated to is the right and the crucible being rotated to the left. The rotational speed of both the seed crystal and the crucible was maintained constant at 30 rpm, and accelerated rotation was not carried out. The heating conditions of the melt were the same as in Example 5. When 5 hours had elapsed after immersing the seed crystals, the seed shaft was lifted such that the crystal was pulled away from the melt to terminate growth. Rotation of the seed shaft and the crucible was then stopped. After the crucible was gradually cooled to room temperature, the crystal was recovered from the seed shaft. A new SiC single crystal had grown on the seed crystal, and it had a growth area which was the same 1-inch diameter as the seed crystal.

COMPARATIVE EXAMPLE 3

A growth test of a SiC single crystal was carried out in the same manner as in Comparative Example 1 except that only Si was charged into a graphite crucible.

When 5 hours had elapsed after immersing the seed crystal, the seed shaft was lifted such that the crystal was pulled away from the melt to terminate growth. Rotation of the seed shaft and the crucible was then stopped. After the crucible was gradually cooled to room temperature, the crystal was recovered from the seed shaft. A new SiC single crystal had grown on the seed crystal, and it had a growth area which was the same 1-inch diameter as the seed crystal.

COMPARATIVE EXAMPLE 4

Example 7 was repeated. However, the rotational speed during crystal growth was maintained constant at 30 rpm for both the seed crystal and the crucible, and accelerated rotation was not carried out.

COMPARATIVE EXAMPLE 5

A growth test of a SiC single crystal was carried out in the same manner as in Comparative Example I except that a graphite crucible was charged with Si and Fe in proportions corresponding to a composition of $Si_{0.45}Fe_{0.55}$ ([M]/([M]+[Si])=0.55).

When 5 hours had elapsed after immersing the seed crystal, the seed shaft was lifted such that the crystal was pulled away from the melt to terminate growth. Rotation of the seed shaft and the crucible was then stopped. After the crucible was gradually cooled to room temperature, the crystal was recovered from the seed shaft. A new SiC single crystal had grown on the seed crystal, and it had a growth area which was the same 1-inch diameter as the seed crystal.

COMPARATIVE EXAMPLE 6

Example 9 was repeated. However, the rotational speed during crystal growth was maintained constant at 30 rpm for both the seed crystal and the crucible, and accelerated rotation was not carried out.

COMPARATIVE EXAMPLE 7

Example 10 was repeated. However, the rotational speed during crystal growth was maintained constant at 30 rpm for both the seed crystal and the crucible, and accelerated rotation was not carried out.

COMPARATIVE EXAMPLE 8

A growth test of a SiC single crystal was carried out in the same manner as in Comparative Example 1 except that a graphite crucible was charged with Si and Co in proportions corresponding to a composition of $Si_{0.09}Co_{0.10}$ ([M]/([M]+[Si])=0.10).

When 5 hours had elapsed after immersing the seed crystal, the seed shaft was lifted such that the crystal was pulled away from the melt to terminate growth. Rotation of the seed shaft and the crucible was then stopped. After the crucible was gradually cooled to room temperature, the crystal was recovered from the seed shaft. A new SiC single crystal had grown on the seed shaft and it had a growth area which was the same 1-inch diameter as the seed crystal.

COMPARATIVE EXAMPLE 9

Example 12 was repeated. However, the rotational speed during crystal growth was maintained constant at 30 rpm for both the seed crystal and the crucible, and accelerated rotation was not carried out.

COMPARATIVE EXAMPLE 10

Comparative Example 1 was repeated, but the gas atmosphere during crystal growth was changed from Ar to He. The time at which the He gas was introduced was the same as in Example 13.

When 5 hours had elapsed after immersing the seed crystal, the seed shaft was lifted such that the crystal was pulled away from the melt to terminate growth. Rotation of the seed shaft and the crucible was then stopped After the crucible was gradually cooled to room temperature, the crystal was recovered from the seed shaft. A new SiC single crystal had grown on the seed crystal, and it had a growth area which was the same 1-inch diameter as the seed crystal.

TABLE 1

| No. | Raw material composition | Rotation of seed shaft | Rotation of crucible | Directions of rotation | Acceleration and deceleration of crucible | Duration of acceleration (s) | Length of maintaining acceleration (s) | Duration of deceleration (s) |
| --- | --- | --- | --- | --- | --- | --- | --- | --- |
| Ex. 1 | Si0.80—Ti0.20 | no | yes | — | yes | 5 | 10 | 5 |
| Ex. 2 | Si0.80—Ti0.20 | yes | yes | same | yes | 5 | 10 | 5 |
| Ex. 3 | Si0.80—Ti-0.20 | yes | yes | opposite | yes | 5 | 10 | 5 |

TABLE 1-continued

| | | | | | | | | |
|---|---|---|---|---|---|---|---|---|
| Ex. 4 | Si0.80—Ti0.20 | yes | yes | same | yes | 5 | 10 | 5 |
| Ex. 5 | Si0.40—Mn0.60 | yes | yes | opposite | yes | 5 | 10 | 5 |
| Ex. 6 | Si | no | yes | — | yes | 5 | 10 | 5 |
| Ex. 7 | Si0.90—Fe0.10 | yes | yes | opposite | yes | 5 | 10 | 5 |
| Ex. 8 | Si0.45—Fe0.55 | yes | yes | opposite | yes | 5 | 10 | 5 |
| Ex. 9 | Si0.30—Fe0.70 | yes | yes | opposite | yes | 5 | 10 | 5 |
| Ex. 10 | Si0.95—Co0.05 | yes | yes | opposite | yes | 5 | 10 | 5 |
| Ex. 11 | Si0.90—Co0.10 | yes | yes | opposite | yes | 5 | 10 | 5 |
| Ex. 12 | Si0.65—Co0.35 | yes | yes | opposite | yes | 5 | 10 | 5 |
| Ex. 13 | Si0.80—Ti0.20 | yes | yes | opposite | yes | 5 | 10 | 5 |
| Ex. 14 | Si0.40—Mn0.60 | yes | yes | opposite | yes | 5 | 10 | 5 |
| Ex. 15 | Si0.90—Fe0.10 | yes | yes | opposite | yes | 5 | 10 | 5 |
| Ex. 16 | Si0.90—Co0.10 | yes | yes | opposite | yes | 5 | 10 | 5 |
| Comp. 1 | Si0.80—Ti0.20 | yes | yes | opposite | no | — | — | — |
| Comp. 2 | Si0.40—Mn0.60 | yes | yes | opposite | no | — | — | — |
| Comp. 3 | Si | yes | yes | opposite | no | — | — | — |
| Comp. 4 | Si0.90—Fe-0.10 | yes | yes | opposite | no | — | — | — |
| Comp. 5 | Si0.45—Fe0.55 | yes | yes | opposite | no | — | — | — |
| Comp. 6 | Si0.30—Fe0.70 | yes | yes | opposite | no | — | — | — |
| Comp. 7 | Si0.95—Co0.05 | yes | yes | opposite | no | — | — | — |
| Comp. 8 | Si0.90—Co0.10 | yes | yes | opposite | no | — | — | — |
| Comp. 9 | Si0.65—Co0.35 | yes | yes | opposite | no | — | — | — |
| Comp. 10 | Si0.80—Ti0.20 | yes | yes | opposite | no | — | — | — |

| No. | Direction of crucible rotation | Temperature gradient of melt (top to bottom) (° C.) | Gas atmosphere Type | Viscosity ($\eta$) ($\mu P$) | Evaluation of inclusions Gas bubbles | Foreign matter | Growth rate of SiC single crystal Rate ($\mu m/hr$) | Evaluation |
|---|---|---|---|---|---|---|---|---|
| Ex. 1 | back and forth | 1700-1750 | Ar | 803 | ○ | ○ | 155 | ◉ |
| Ex. 2 | back and forth | 1700-1750 | Ar | 803 | ○ | ○ | 190 | ◉ |
| Ex. 3 | back and forth | 1700-1750 | Ar | 3 | ○ | ○ | 240 | ◉ |
| Ex. 4 | one direction | 1700-1750 | Ar | 803 | ○ | ○ | 170 | ◉ |
| Ex. 5 | back and forth | 1600-1650 | Ar | 777 | ○ | ○ | 340 | ◉ |
| Ex. 6 | back and forth | 1700-1750 | Ar | 803 | ○ | ○ | 75 | ◉ |
| Ex. 7 | back and forth | 1700-1750 | Ar | 803 | ○ | ○ | 255 | ◉ |
| Ex. 8 | back and forth | 1700-1750 | Ar | 803 | ○ | ○ | 320 | ○ |
| Ex. 9 | back and forth | 1700-1750 | Ar | 803 | ○ | ○ | 270 | ○ |
| Ex. 10 | back and forth | 1700-1750 | Ar | 803 | ○ | ○ | 245 | ◉ |
| Ex. 11 | back and forth | 1700-1750 | Ar | 803 | ○ | ○ | 285 | ○ |
| Ex. 12 | back and forth | 1700-1750 | Ar | 803 | ○ | ○ | 265 | ◉ |
| Ex. 13 | back and forth | 1700-1750 | He | 683 | ○ | ○ | 245 | ◉ |
| Ex. 14 | back and forth | 1600-1650 | He | 661 | ○ | ○ | 330 | ○ |
| Ex. 15 | back and forth | 1700-1750 | He | 683 | ○ | ○ | 250 | ○ |
| Ex. 16 | back and forth | 1700-1750 | He | 683 | ○ | ○ | 280 | ○ |
| Comp. 1 | back and forth | 1700-1750 | Ar | 803 | X | X | 70 | — |
| Comp. 2 | back and forth | 1600-1650 | Ar | 777 | X | X | 165 | — |
| Comp. 3 | back and forth | 1700-1750 | Ar | 803 | X | X | 20 | — |
| Comp. 4 | back and forth | 1700-1750 | Ar | 803 | X | X | 120 | — |
| Comp. 5 | back and forth | 1700-1750 | Ar | 803 | X | X | 185 | — |
| Comp. 6 | back and forth | 1700-1750 | Ar | 803 | X | X | 150 | — |
| Comp. 7 | back and forth | 1700-1750 | Ar | 803 | X | X | 100 | — |
| Comp. 8 | back and forth | 1700-1750 | Ar | 803 | X | X | 145 | — |
| Comp. 9 | back and forth | 1700-1750 | Ar | 803 | X | X | 130 | — |
| Comp. 10 | back and forth | 1700-1750 | He | 683 | ○ | X | 70 | — |

Figure 1:
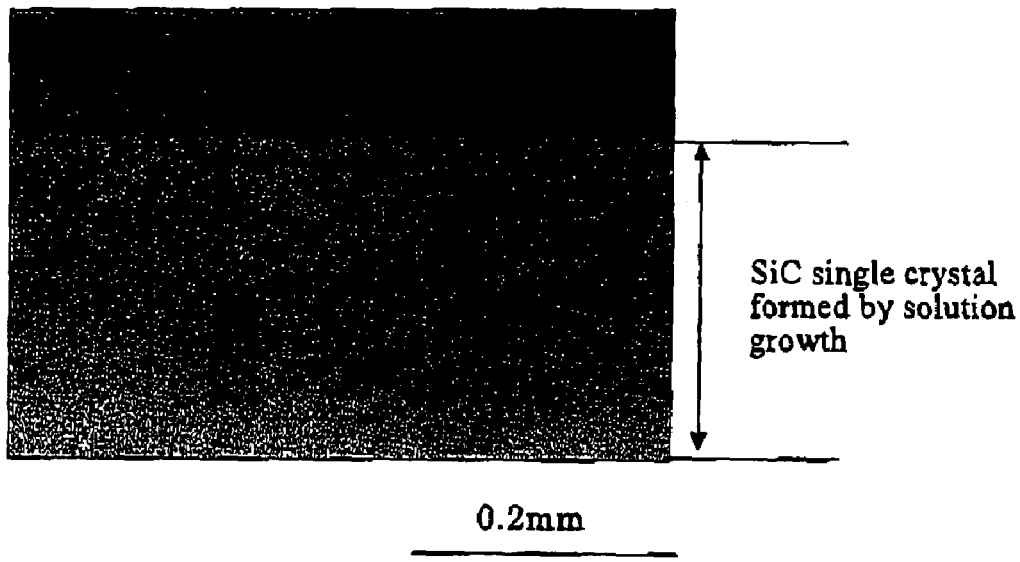
FIG. 1 is an optical photomicrograph showing a cross section of a SiC crystal which was grown by the conventional solution growth method and which contains inclusions.

As shown in Table 1, regardless of the melt composition, in Comparative Examples 1-10 in which ACRT (accelerated crucible rotation technique) was not applied, inclusions (foreign matters) like those shown in FIG. 1 which resulted from incorporation of a solvent into the crystal were observed inside the crystal.

In contrast, when ACRT was applied in accordance with the present invention, regardless of the type of solvent (Si or a Si alloy) or the method of rotation (back and forth rotation or only in one direction), or whether the seed shaft (seed crystal) was rotated, a crystal having no inclusions in the form of either foreign matter or gas bubbles could be grown under all rotational conditions. In addition, the crystal growth rate was higher than when ACRT was not applied, and particularly when the solvent was a Si alloy, a high crystal growth rate of at least 150 micrometers per hour and a maximum of 200 micrometers per hour or higher could be achieved while maintaining good crystal quality. In particular, when a Si—Fe or Si—Co alloy was used as a solvent, an extremely high growth rate exceeding 240 micrometers per hour could be achieved by combining ACRT and an optimal melt composition.

It can be seen from Comparative Example 10 that if the gas atmosphere is He which has a viscosity $\eta$ of at most 750 $\mu P$ at the temperature of crystal growth, the formation of gas bubbles which was observed in Comparative Examples 1-4 using Ar as the gas atmosphere is suppressed. However, as shown in Examples 1-12, the formation of gas bubbles is prevented even when the gas atmosphere is Ar if ACRT is applied in accordance with the present invention. As shown in Examples 13-16, if ACRT is applied and the gas atmosphere is changed to He, the formation of gas bubbles is prevented with even more certainty. As a result, the quality of SiC crystals is further increased.

In the above, certain embodiments of the present invention were described, but the embodiments and examples disclosed here are in all respects for illustration purpose and and are not limiting. The scope of the present invention encompasses equivalents of the claims and all variations within the scope thereof.

The invention claimed is:

1. A method for producing a silicon carbide single crystal comprising immersing a seed crystal on which SiC is to be grown by the solution growth method and which is attached to a seed shaft in a melt in a rotating crucible, the melt comprises Si and C and at least one metal element M and containing silicon carbide (SiC) dissolved therein, and allowing a SiC single crystal to grow on the seed crystal by creating a supersaturated SiC concentration in the melt at least in the periphery of the seed crystal, characterized in that the melt is stirred by periodically changing the rotational speed or the rotational speed and the rotational direction of the crystal, wherein M is at least one element selected from Ti, Mn, Fe, and Co, and when expressing the molar concentration of M in the melt as [M] and the molar concentration of Si as [Si], the value of [M]/([M]+[Si]) is, at least 0.1 and at most 0.25 when M is Ti;
at least 0.1 and at most 0.7 when M is Mn:
at least 0.2 and at most 0.7 when M is Fe; and
at least 0.05 and at most 0.25 when M is Co.

2. A method as set forth in claim 1 wherein the rotational speed of the crucible is periodically varied by making
  (1) acceleration to a first set rotational speed A1,
  (2) maintaining rotation at the first rotational speed A1, and
  (3) decelerating to a second set rotational speed A2 (A2<A1)
one cycle and repeating the cycle (wherein the set value of each of the rotational speeds A1 and A2 may be varied in each cycle).

3. A method as set forth in claim 1 wherein the rotational speed and rotational direction of the crucible are periodically varied by making
  (1) acceleration to a first set rotational speed B1 in a first rotational direction,
  (2) maintaining rotation at rotational speed B1 in the first rotational direction,
  (3) decelerating to a second rotational speed of 0 rpm,
  (4) accelerating to a set rotational speed B2 in a second opposite rotational direction (wherein B2 and B1 may be the same or different from each other),
  (5) maintaining rotation at set value B2 in the second rotational direction, and
  (6) decelerating to a rotational speed of 0 rpm
one cycle and repeating this cycle (wherein the set value of each rotational speeds B 1 and B2 may be varied in each cycle).

4. A method as set forth in claim 1 wherein the seed shaft is rotated together with the crucible in the same or the opposite rotational direction.

5. A method as set forth in claim 4 wherein rotation of the seed shaft is synchronous with rotation of the crucible.

6. A method as claimed in claim 1 wherein the gas atmosphere during growth of the single crystal is a nonoxidizing gas having a viscosity $\eta$ which satisfied $\eta \leq 750$ $\mu P$ ($\mu P$=micropoise) at the temperature of single crystal growth.

7. A method for producing a silicon carbide single crystal comprising immersing a seed crystal on which SiC is to be grown by the solution growth method and which is attached to a seed shaft in a melt in a rotating crucible, the melt comprising (1) Si and C or (2) Si and C and at least one metal element M and containing silicon carbide (SiC) dissolved therein, and allowing a SiC single crystal to grow on the seed crystal by creating a supersaturated SiC concentration in the melt at least in the periphery of the seed crystal, characterized in that the melt is stirred by periodically changing the rotational speed or the rotational speed and the rotational direction of the crystal, wherein the gas atmosphere during growth of the single crystal is a nonoxidizing gas having a viscosity $\eta$ which satisfied $\eta \leq 750$ $\mu P$ ($\mu P$=micropoise) at the temperature of single crystal growth.

8. A method as set forth in claim 7 wherein the rotational speed of the crucible is periodically varied by making
  (1) acceleration to a first set rotational speed A1,
  (2) maintaining rotation at the first rotational speed A1, and
  (3) decelerating to a second set rotational speed A2 (A2<A1)
one cycle and repeating the cycle (wherein the set value of each of the rotational speeds A1 and A2 may be varied in each cycle).

9. A method as set forth in claim 7 wherein the rotational speed and rotational direction of the crucible are periodically varied by making
  (1) acceleration to a first set rotational speed B1 in a first rotational direction,
  (2) maintaining rotation at rotational speed B1 in the first rotational direction,
  (3) decelerating to a second rotational speed of 0 rpm,
  (4) accelerating to a set rotational speed B2 in a second opposite rotational direction (wherein B2 and B1 may be the same or different from each other),
  (5) maintaining rotation at set value B2 in the second rotational direction, and
  (6) decelerating to a rotational speed of 0 rpm
one cycle and repeating this cycle (wherein the set value of each rotational speeds B1 and B2 may be varied in each cycle).

10. A method as set forth in claim 7 wherein the seed shaft is rotated together with the crucible in the same or the opposite rotational direction.

11. A method as set forth in claim 10 wherein rotation of the seed shaft is synchronous with rotation of the crucible.

* * * * *